United States Patent [19]
Harcombe

[11] 3,821,610
[45] June 28, 1974

[54] THICK FILM CIRCUITRY

[75] Inventor: Thomas Lyn Harcombe, Efail Isaf, Pontypridd Glamorgan, Wales

[73] Assignee: A.B. Electronic Components Limited, Glamorgan, Wales

[22] Filed: Feb. 27, 1973

[21] Appl. No.: 336,178

[30] Foreign Application Priority Data

Mar. 1, 1972 Great Britain ...................... 9610/72

[52] U.S. Cl. ............ 317/101 C, 333/84 M, 334/15
[51] Int. Cl. ............................................ H05k 5/00
[58] Field of Search..... 317/101 R, 101 C, 101 CM, 317/101 DH; 330/68; 325/357; 334/15; 333/84 M

[56] References Cited

UNITED STATES PATENTS

| | | | |
|---|---|---|---|
| 2,718,623 | 9/1955 | Yoder et al. | 317/101 R |
| 3,649,937 | 3/1972 | Carlson | 334/15 |

FOREIGN PATENTS OR APPLICATIONS

| | | | |
|---|---|---|---|
| 1,100,751 | 1/1968 | Great Britain | 334/15 |

*Primary Examiner*—David Smith, Jr.
*Attorney, Agent, or Firm*—Steward & Steward

[57] ABSTRACT

In order to provide screening to prevent unwanted coupling between components on opposite sides of a thick film substrate circuit element, components on one side are located directly opposite printed earth areas of components in the other side.

4 Claims, 1 Drawing Figure

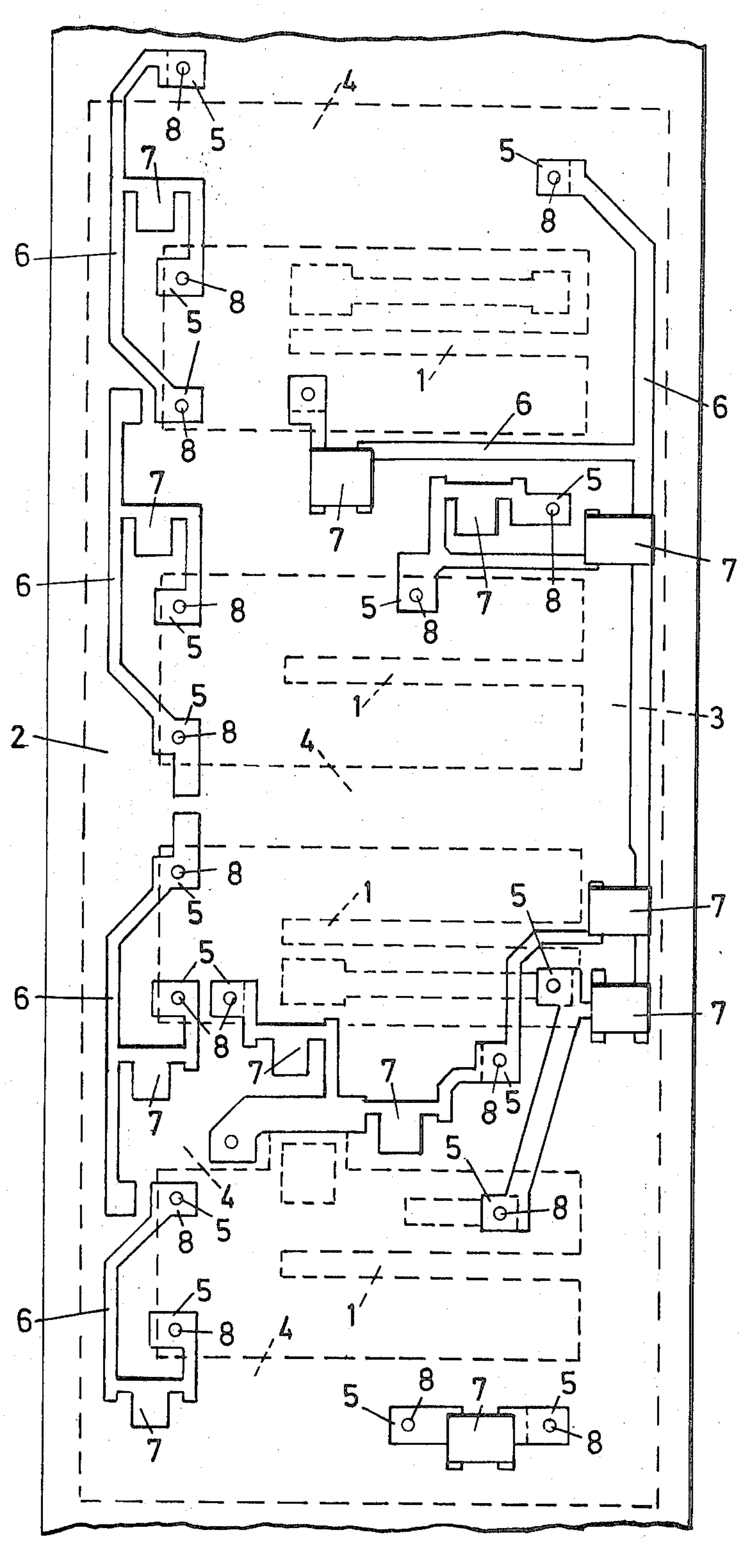
1
2
3
4
5
6
7
8

THICK FILM CIRCUITRY

This invention relates to thick film circuitry for radio frequency use.

A principal problem of thick film circuitry for radio frequency use, when some or all of the components are patterns printed on the substrate with conductive, resistive or capacitive inks, is that of unwanted coupling between the components and the circuitry.

According to the present invention, there is provided a thick film circuit element comprising a substrate having components on two sides thereof, one side having at least one component with an earth area printed with conductive ink, and the components on the other side being located directly opposite the earth area or areas.

Such location of components, particularly thick film components, leads to minimum alteration in the basic characteristics of the circuitry by unwanted coupling.

The invention is particularly applicable where the circuitry associated with the earth area is a resonant transmission line.

Connection through or around the substrate may be provided as required for electrical and support purposes.

This invention enables maximum use to be made of substrate area with circuits and components on two sides of the substrate and overcomes the unwanted coupling that can occur between components and the radio frequency circuitry involved.

The invention will be further described with reference to the accompanying drawing, of which the single FIGURE is a plan view of the reverse side of a thick film substrate with a typical pattern of resistive and conductive inks thereon arranged in accordance with the present invention, and showing the pattern on the front side.

The pattern on the front side is shown in dashed lines and comprises a series of transmission lines having center conductors 1 surrounded by earth areas, which are coplanar with the transmission lines. The earth areas consist of edge portions 2 and 3 and transverse portions 4 which become common to two transmission lines where they lie between two of the center conductors 1. The discrete components have been omitted for clarity of illustration, as their positions form no part of the present invention, but it will be understood that they will normally be present and connections will be provided to complete the required circuitry. The illustrated substrate is intended to form a U.H.F. tuner unit for a television receiver when the appropriate discrete components have been added and the appropriate connections made.

On the reverse side of the substrate, which is the side shown in full lines, there are provided a number of printed connector pads 5 to receive the wire connections from descrete components, and also connecting conductors 6, all in conductive ink. Also printed, in resistive ink, are resistor areas 7 which are circuit components, and it will be noticed that each of these resistive areas 7 is located opposite part of an earth area 2, 3 or 4 so as to provide effective screening between these components and the active components on the front side of the substrate, whether these components are the center conductors 1 or discrete components.

The pads 5 have holes in them for connections to be taken through the substrate between components on opposite sides.

It will be appreciated that the invention is not limited solely to U.H.F. tuners for television receivers, but is widely applicable in thick film circuitry techniques where the frequencies involved are such that there is a risk of unwanted coupling between the components.

Various modifications may be made within the scope of the invention.

I claim:

1. A thick film circuit element comprising a substrate having a transmission line on a first side of said substrate including at least one component, earth areas printed in conductive ink on the same side of said substrate as said transmission line, said earth areas being located adjacent said transmission line and coplanar therewith, and additional components printed in conductive ink on the other side of said substrate located directly opposite a said earth area, thereby providing screening between said additional components on said other side of said substrate and said transmission line on said first side in order to prevent unwanted coupling therebetween.

2. A thick film circuit element as claimed in claim 1, in which the component associated with the earth areas is a resonant transmission line.

3. A thick film circuit element as claimed in claim 1, including connections between the components on opposite sides of the substrate.

4. A thick film circuit element as claimed in claim 3, in which the connections pass through the substrate.

* * * * *